United States Patent
Finkler et al.

(10) Patent No.: US 6,437,340 B1
(45) Date of Patent: Aug. 20, 2002

(54) PLANAR IMAGE DETECTOR FOR ELECTROMAGNETIC RADIATION, PARTICULARLY X-RAYS

(75) Inventors: Klaus Finkler, Spardorf; Kurt Grapengeter, Moehrendorf; Thomas Schirl, Forchheim; Reiner F. Schulz, Dormitz; Reiner Staab, Baiersdorf, all of (DE)

(73) Assignee: Siemens Aktiengesellschaft, Munich (DE)

( * ) Notice: Subject to any disclaimer, the term of this patent is extended or adjusted under 35 U.S.C. 154(b) by 91 days.

(21) Appl. No.: 09/665,812

(22) Filed: Sep. 20, 2000

(30) Foreign Application Priority Data

Sep. 20, 1999 (DE) .......................................... 199 45 023

(51) Int. Cl.[7] .......................... H01L 27/146; G01T 1/24
(52) U.S. Cl. ............................. 250/370.11; 250/370.01; 250/370.08; 250/370.09; 250/208.1
(58) Field of Search ...................... 250/370.01, 370.08, 250/370.09, 370.11, 370.14, 208.1; 257/291; 348/245; 378/98.8

(56) References Cited

U.S. PATENT DOCUMENTS

| 4,678,938 A | | 7/1987 | Nakamura |
| 5,159,186 A | | 10/1992 | Ohzu |
| 5,617,461 A | | 4/1997 | Schreiner |
| 5,648,660 A | * | 7/1997 | Lee et al. ............... 250/370.09 |
| 6,028,314 A | * | 2/2000 | Finkler .................. 250/370.11 |

FOREIGN PATENT DOCUMENTS

| EP | 0 275 217 | 7/1988 |
| EP | 0 469 878 | 2/1992 |
| EP | 0 479 534 | 4/1992 |
| EP | 0 838 859 | 4/1998 |

OTHER PUBLICATIONS

Patents Abstracts of Japan, E–1254, Aug. 26, 1992, vol. 16/No. 403, For Japanese Application 4–134863.
Patents Abstracts of Japan, E–1058, Apr. 19, 1991, vol. 156/No. 157, For Japanese Application 3–29368.

* cited by examiner

*Primary Examiner*—Seungsook Ham
*Assistant Examiner*—Timothy Moran
(74) *Attorney, Agent, or Firm*—Schiff Hardin & Waite

(57) ABSTRACT

A planar image detector for electromagnetic radiation has radiation-sensitive pixel elements arranged in a matrix that has a surface with active pixels for imaging and a surface with correction pixels, not exposed to the radiation for generating correction signals, and with contact surfaces next to the surfaces with the pixels. The surface with the correction pixels is arranged in a different plane from the surface with the active pixels and at one of the sides of the image detector with the contact surfaces of the active pixels.

11 Claims, 5 Drawing Sheets

PLANAR IMAGE DETECTOR FOR ELECTROMAGNETIC RADIATION, PARTICULARLY X-RAYS

BACKGROUND OF THE INVENTION

1. Field of the Invention

The present invention is directed to a planar image detector for electromagnetic radiation of the type having radiation-sensitive pixel elements arranged in a matrix that has a surface with active pixels for imaging and a surface with correction pixels, not exposed to the radiation, for generating correction signals, and having contact surfaces next to the surfaces with the pixels.

2. Description of the Prior Art

Image detectors of the above type are utilized, for example, in X-ray diagnostic devices as shown in FIG. 1.

FIG. 1 shows an X-ray diagnostic apparatus known from German PS 195 27 148 having an X-ray tube 2, supplied with high-voltage and filament voltage by a voltage generator 1, that generates a conical beam of X-rays 3 that penetrates a patient 4 and generates radiation images on a solid-state detector 5 that is sensitive to the X-rays 3. The output signal of the solid state detector 6 is supplied to an image system 7. The imaging system 7 can include converters, image memories and processing circuits. The output of the imaging system 7 is supplied to a monitor 8 for playback of the acquired X-ray images. Operating elements 9 are connected via a system control and communication unit 10 to the other components of the X-ray diagnostic apparatus.

FIG. 2 shows a known solid-state detector 5 in a perspective cross-section. The core component of the solid-state detector 5 composed of a solid-state pixel matrix, line drivers and amplifiers. The solid-state pixel matrix is in turn composed of a layer with a scintillator 11 of, for example, cesium iodide (CsI) that, when irradiated by the X-rays 3, supplies visible photons to a pixel matrix 12 of amorphous silicon that produces a visible X-ray image. As shown enlarged in FIG. 2, each of the pixels or picture elements of this pixel matrix 12 is composed of a photodiode 13 and a switch that is connected to row lines 15 and column lines 16. The pixel matrix 12 is applied on a glass substrate 20.

All pixels of a line are simultaneously addressed by the line drivers 17 and are read out. The signals are processed in parallel in a number of amplifiers 18. In the simplest case, an image is progressively read out line-by-line.

Two undesired components ("offset signals") add to the desired signals. The first component varies from pixel-to-pixel. The second component is the same for all pixels of a line but varies from line-to-line and from frame-to-frame. This so-called line noise is very disturbing since the eye is highly receptive to extended gray scale differences.

German PS 195 27 148 discloses an arrangement for correcting the line signal ("line noise correction") in an a-Si panel, wherein an unirradiated edge zone lies at the left image edge, i.e. the line start, in a radiographic solid-state detector, for example an a-Si detector. This dark reference zone (DRZ) 22 shown in FIG. 3 herein is covered in a light-tight and radiation-tight manner by a lead shielding 21, so that no additional signal arises in the bright image. The signal values of the unilluminated pixels are utilized for correction of the line signal. They serve the purpose of reducing the line noise and correcting small transients in the offset.

The output signal of a line is shown over the column number n in FIG. 4. The signal S is composed only of the line offset 23 in the region of the DRZ 22. This is determined by averaging the values of the individual, occluded pixels of a line. These line offsets 23 are then subtracted from the signal values of all pixels of the same line.

In the known solid-state detector 5 schematically shown in FIG. 5, the active surface 24 should extend as far as possible to the outside edge of the housing 25, so that the edge region 26 that is not usable for imaging, is as small as possible. The area of the pixels 28 for the DRZ 22 shown in FIG. 6 can have a width of, for example, 5–15 mm and thus considerably enlarges the distance of the active surface 24 from the outside edge of the housing 25, and thus the edge region 26.

In order for pixels to be used as DRZ pixels 28, they must be driven by the same channels of the line drivers 17 as the pixels to be corrected. Insofar as possible, further, they must exhibit the same properties as the active pixels 29 to be corrected. This is assured when the DRZ pixels 28 are manufactured on the same glass substrate 20 with the same production steps such as a-Si:H deposition, photolithography, etching processes, etc.

A typical manufacturing procedure for an a-Si pixel matrix is explained on the basis of FIG. 6. Contact surfaces 30, as well as a surface (28 and 29) composed of pixels with photodiode 13 and switch 14 are produced on the glass substrate 20. The areas of the active pixels 29 and those of the pixels 28 for the DRZ 22 do not differ in terms of their structure. The difference between the active pixels 29 and the pixels 28 for the DRZ 22 arise only by covering with the lead shielding 21 and/or by non-coating with scintillator material according to FIG. 3. The saw lines 31 (kerfs) indicate how the pixel matrix 12 is sawn from the glass substrate 20.

U.S. Pat. No. 4,678,938 discloses a solid-state image converter with a control loop for the voltage of the line selection signal dependent on the output signal from the pixels of a dark reference zone allocated to the corresponding line, so that the output signal of the active pixels becomes free of offset and dark current.

European Application 0 838 859 discloses a photoelectric conversion unit having signal correction for generating, in particular, moving images, wherein some pixels are covered by shielding against X-rays and light.

SUMMARY OF THE INVENTION

An object of the present invention is to provide a planar image detector of the type initially described wherein the image-active area is optimally large in relationship to the overall area, so that the image-inactive edge regions are as narrow as possible.

This object is inventively achieved in a planar image detector wherein the area with the correction pixels is arranged in a different plane from the area with the active pixels and at one of the sides of the image detector with the contact surfaces of the active pixels. The contact surfaces can be arranged separately from the imaging part of the image detector or on the back side thereof.

It has proven advantageous when the image detector is implemented in two pieces, with a first detector part with the correction pixels being arranged in front of or behind a contact surface of the active pixels of a second detector part, in the radiation propagation direction.

The image-inactive edges become especially small when the first detector part with the correction pixels is arranged perpendicularly to the second detector part with the active pixels.

An identical structure of the two detector parts is obtained by sawing them both from a substrate on which they are manufactured in common.

As a further alternative, the image detector can be inventively arranged on a substrate, and the area with the correction pixels can be arranged following one of the contact surfaces of the active pixels in the radiation direction on that side of the substrate lying opposite the active pixels.

Inventively, the area with the correction pixels can be covered from radiation by a lead shielding and/or only the area with the active pixels can be covered with a scintillator for converting X-rays into visible light.

The layer with the pixels can be composed of amorphous silicon (aSi, aSi:H).

DESCRIPTION OF THE PREFERRED EMBODIMENTS

Figure 6:
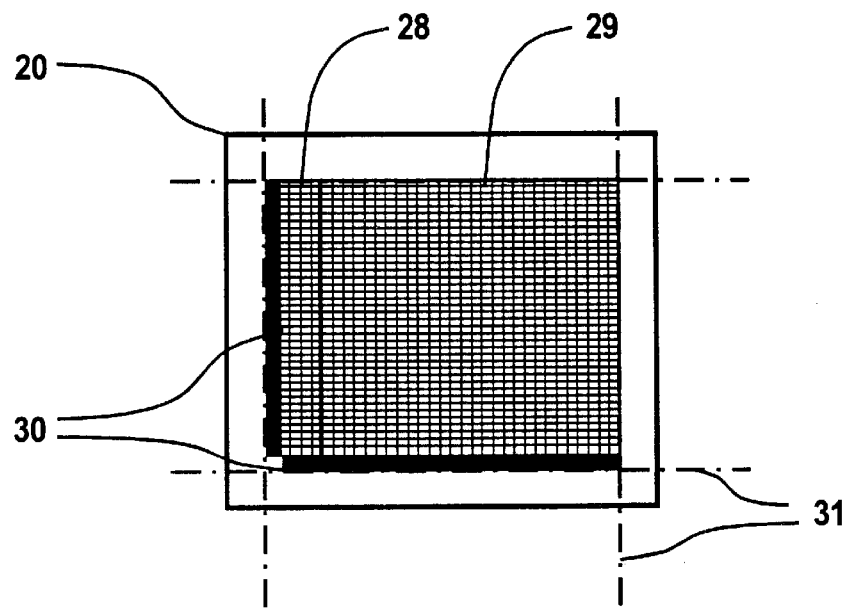
FIG. 6 shows a known X-ray detector with contact surfaces and DRZ in a plan view, as explained above.
Figure 7:
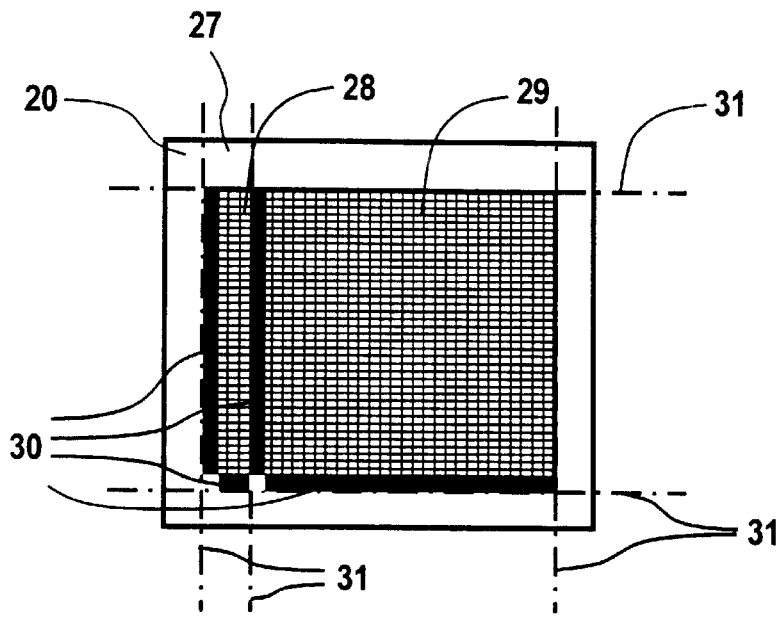
FIG. 7 shows an inventive X-ray detector with contact surfaces and a DRZ during its manufacture, in plan view.

FIG. 7 shows an inventively coated glass substrate 20. The pixels 28 and 29 do not otherwise differ. The difference compared to the embodiment in FIG. 6 is that two detector parts are produced by sawing along the saw lines 31. The small detector part 27 with the pixels 28 can continue to be used as the dark reference zone DRZ 22, but can be attached at an arbitrary, more advantageous location.

Figure 8:
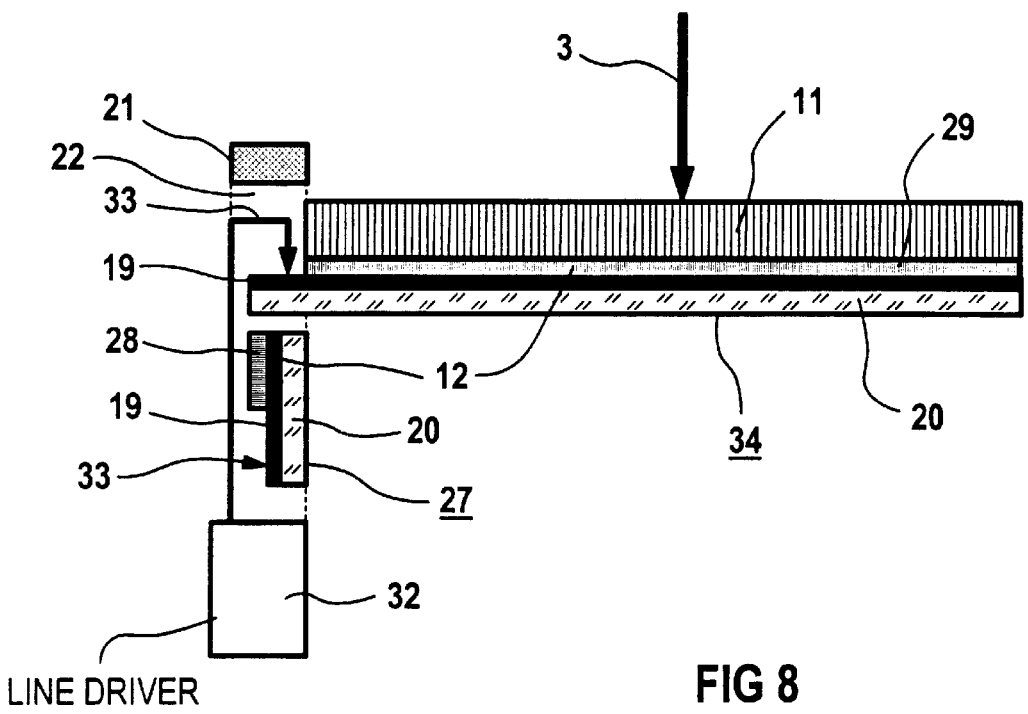
FIG. 8 is a cross-section through an inventive X-ray detector.

FIG. 8 shows an example of the structure of an inventive solid-state detector 5 in cross-section. The contacts 19 for the active pixels 29 of the pixel matrix 12 lying thereabove are situated on the glass substrate 20. These are covered by the scintillator 11. The side region is free of active pixels 29 and the scintillator 11, so that the contacts 19 can be connected to the line driver 32 via electrical terminals 33. This region is also covered by lead shielding 21 opaque to X-rays 3. This detector part 34 forms the active part of the solid-state detector 5.

The detector part 27 with the pixels 28 for the DRZ 22 is located under the glass substrate 20. This is composed of the same glass substrate 20 from which it was cut. The contacts 19 are again located on this glass substrate 20 and the pixels 28 for the DRZ 22 are located on a part of the substrate surface. The other part serves for contacting to the electrical terminals 33. The detector part 27 for the DRZ 22 resides perpendicularly on the glass substrate 20 of the active pixels 29 and is covered by the lead shielding 21.

Inventively, however, the detector part 27 with the pixels 28 for the DRZ 22 alternatively can be arranged between the active detector part 34 and the lead shielding 21. It can also be applied on the underside of the glass substrate 20 in the region of the contacts 19 covered by the lead shielding 21.

Figure 1:
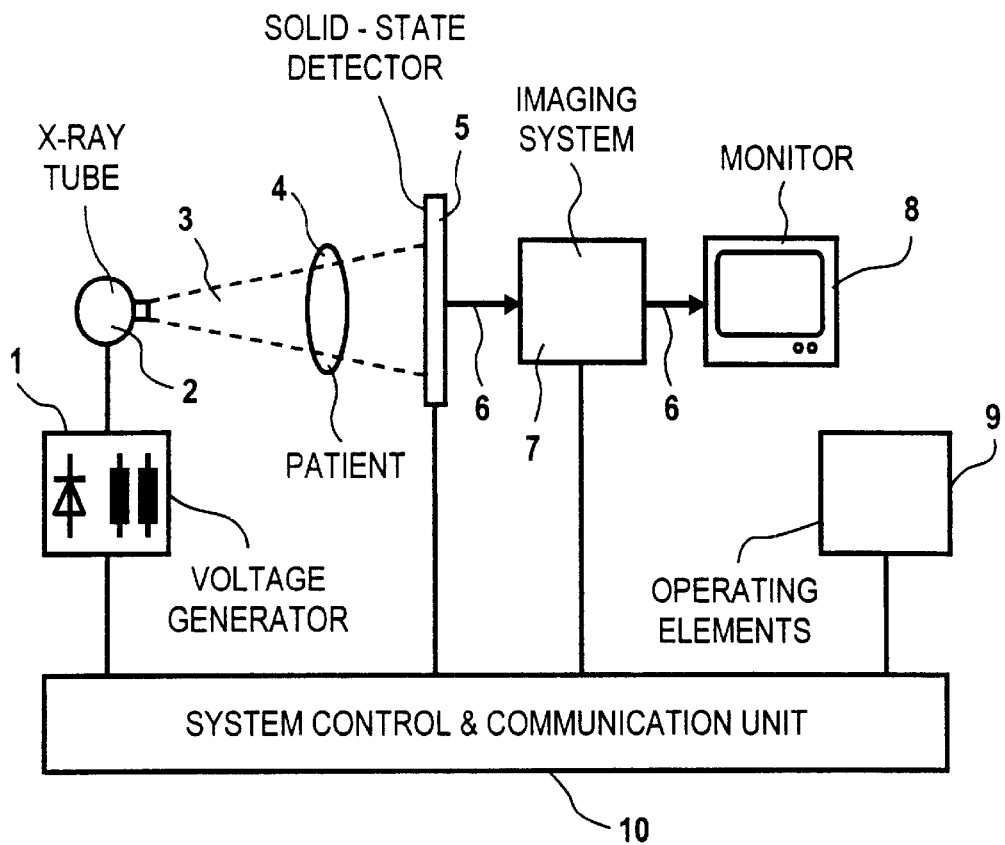
FIG. 1 shows a known X-ray diagnostic apparatus with an X-ray detector, as explained above.
Figure 2:
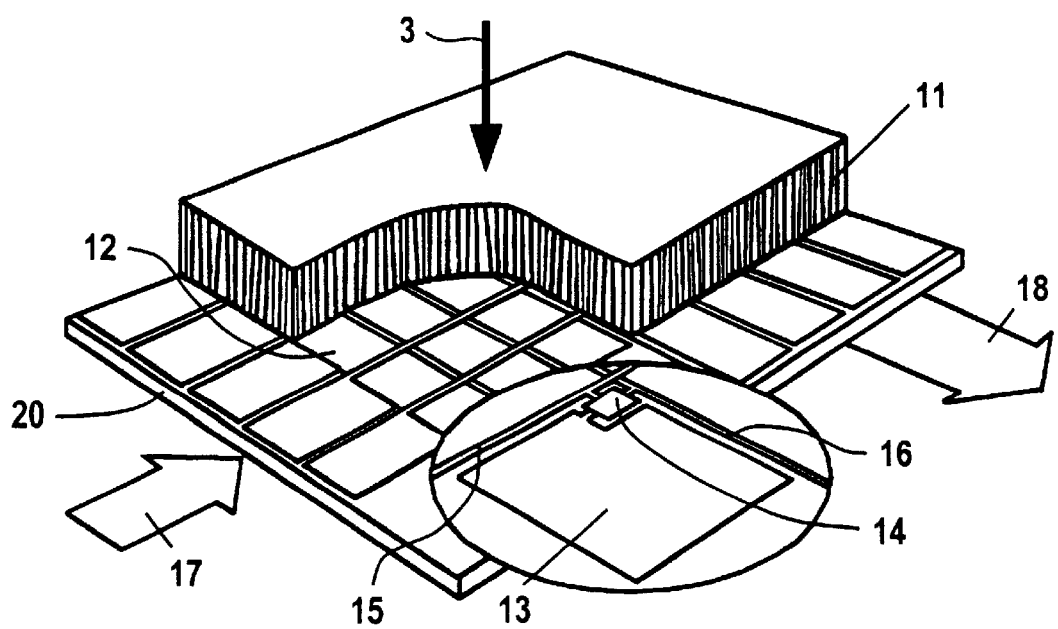
FIG. 2 is a perspective view of a known X-ray detector, as explained above.
Figure 3:
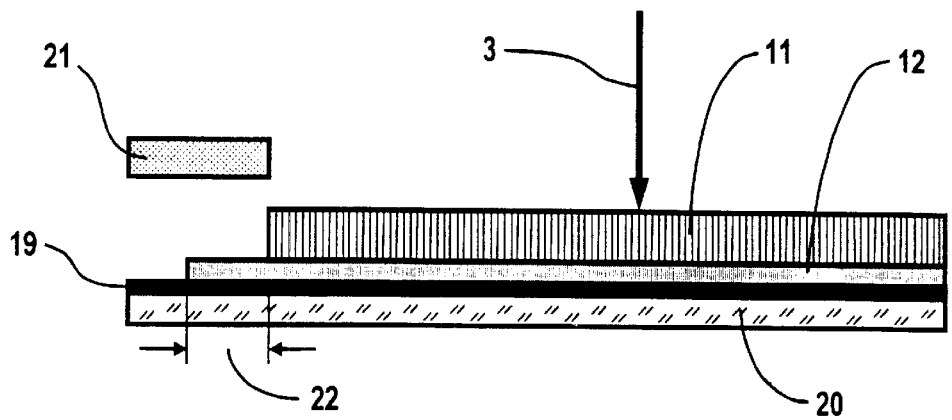
FIG. 3 is a cross-section through a known X-ray detector with a DRZ, as explained above.
Figure 4:
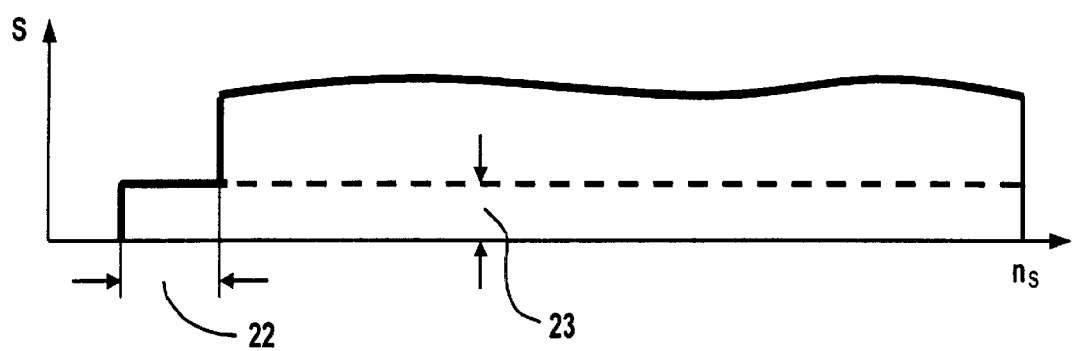
FIG. 4 shows a typical signal curve of the X-ray detector according to FIG. 3 over its cross-section, as explained above.
Figure 5:
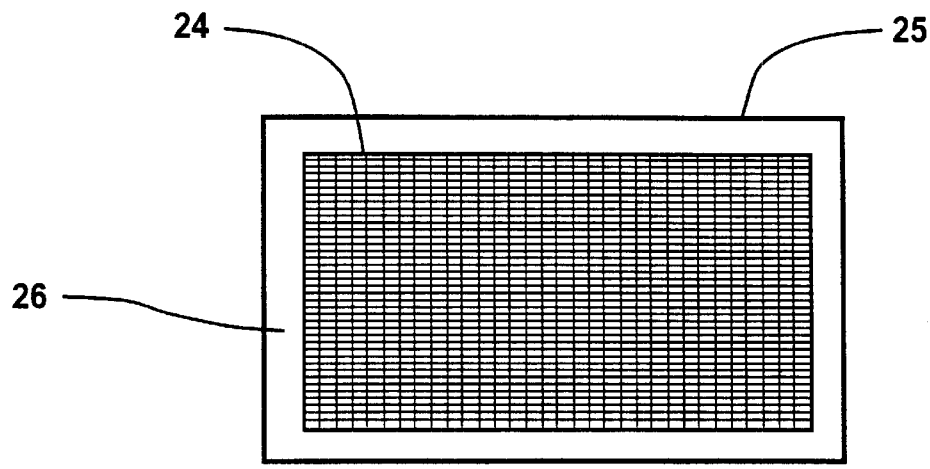
FIG. 5 shows a known X-ray detector in plan view, as explained above.

As can be seen by comparing the detector according to FIG. 8 to the detector of FIG. 4, the dark reference zone DRZ 22 no longer lies between active, image-active sensor area with the active pixels 29 and the outside edge of the housing 25, but instead lies thereunder, so that the active area lies closer to the outside edge and the edge region 26 is drastically diminished.

In the example of FIG. 8, no scintillator 11 is located on the DRZ 22, however, it still can be advantageous to also apply the scintillator 11 on the DRZ 22.

The basic principle can also be utilized in solid-state detectors 5 that employ other materials or principles. For example, the absorbent layer can be composed of a material such as amorphous selenium, lead iodide or lead oxide wherein charge carriers are directly generated by incident of X-rays and the presence of a suitable electrical field. These charge carriers are detected in a pixel matrix situated therebelow. This pixel matrix can be composed of amorphous silicon (a-Si:H), with each pixel being composed of an electrode, a collection capacitor and a switch.

Although modifications and changes may be suggested by those skilled in the art, it is the intention of the inventors to embody within the patent warranted hereon all changes and modifications as reasonably and properly come within the scope of their contribution to the art.

We claim as our invention:

1. A planar image detector for electromagnetic radiation, comprising:
    a matrix composed of radiation-sensitive pixel elements, said matrix having a first surface containing active pixels for imaging and a second surface containing correction pixels, which are not exposed to radiation, for generating correction signals;
    respective contact surfaces electrically connected to said first and second surfaces and disposed at a side of said matrix; and
    said second surface containing said correction pixels being disposed in a different plane from said first surface containing said active pixels, and being disposed at said side of said matrix with said contact surface for said active pixels.

2. A planar image detector as claimed in claim 1 comprising a first detector part and a second detector part disposed behind said first detector part in a direction of propagation of said radiation, said first detector part containing said correction pixels and said second detector part containing said contact surface for said active pixels.

3. A planar image detector as claimed in claim 2 wherein said first detector part is disposed perpendicularly relative to said second detector part.

4. A planar image detector as claimed in claim 2 wherein both of said first and second detector parts are manufactured in common on a single substrate, and are respectively sawn from said substrate.

5. A planar image detector as claimed in claim 1 comprising a first detector part and a second detector part disposed in front of said first detector part in a direction of propagation of said radiation, said first detector part containing said correction pixels and said second detector part containing said contact surface for said active pixels.

6. A planar image detector as claimed in claim 5 wherein said first detector part is disposed perpendicularly relative to said second detector part.

7. A planar image detector as claimed in claim 5 wherein both of said first and second detector parts are manufactured in common on a single substrate, and are respectively sawn from said substrate.

8. A planar image detector as claimed in claim 1 wherein said matrix is disposed on a substrate and wherein said second surface is disposed following said contact surface for said active pixels in a direction of propagation of said radiation on a side of said substrate disposed opposite said active pixels.

9. A planar image detector as claimed in claim 1 further comprising a shielding which is opaque to said radiation disposed on said second surface with said correction pixels and covering said correction pixels.

10. A planar image detector as claimed in claim 1 wherein said radiation comprises x-rays, and wherein said planar image detector further comprises a scintilator for converting said x-rays into visible light disposed only on said surface containing said active pixels and covering said active pixels.

11. A planar image detector as claimed in claim 1 wherein each of said first and second surfaces is composed of amorphous silicon.

* * * * *